United States Patent
Baek et al.

(10) Patent No.: US 8,344,601 B2
(45) Date of Patent: Jan. 1, 2013

(54) LIGHT EMITTING DEVICE

(75) Inventors: Joong-Hyun Baek, Suwon-si (KR); Hee-Jin Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 359 days.

(21) Appl. No.: 12/691,156

(22) Filed: Jan. 21, 2010

(65) Prior Publication Data

US 2010/0181887 A1    Jul. 22, 2010

(30) Foreign Application Priority Data

Jan. 21, 2009  (KR) .................. 10-2009-0005231

(51) Int. Cl.
*H01J 1/02*    (2006.01)
(52) U.S. Cl. ........................................ 313/46
(58) Field of Classification Search ............ 313/11, 313/45, 46, 498
See application file for complete search history.

(56) References Cited

U.S. PATENT DOCUMENTS

| | | | |
|---|---|---|---|
| 6,828,170 B2 | 12/2004 | Roberts et al. | |
| 2007/0145403 A1* | 6/2007 | Tomioka et al. | 257/99 |
| 2007/0164408 A1* | 7/2007 | Yeh et al. | 257/676 |
| 2007/0290613 A1* | 12/2007 | Choi et al. | 313/506 |
| 2008/0180014 A1* | 7/2008 | Tzeng et al. | 313/46 |
| 2009/0134417 A1* | 5/2009 | Sato et al. | 257/98 |

FOREIGN PATENT DOCUMENTS

| | | |
|---|---|---|
| JP | 2002-368285 A | 12/2002 |
| KR | 2003-0024283 A | 3/2003 |

* cited by examiner

*Primary Examiner* — Anh T. Mai
*Assistant Examiner* — Andrew Coughlin
(74) *Attorney, Agent, or Firm* — Sughrue Mion, PLLC

(57) ABSTRACT

A light emitting device with improved heat dissipation is provided. The light emitting device includes a first lead frame, a second lead frame, a light emitting element and a housing. The first lead frame includes a light emitting element mounting portion, a first heat dissipation portion extending from the light emitting element mounting portion in a first direction, and second and third heat dissipation portions extending from the light emitting element mounting portion in a second direction opposite to the first direction. The second lead frame extends in the second direction and is disposed between and spaced apart from the second and third heat dissipation portions. The light emitting element is mounted on the light emitting element mounting portion and is electrically coupled to the first and second lead frames. The housing encapsulates the first and second lead frames. The second and third heat dissipation portions have a first width and the second lead frame has a second width the same as or different from the first width.

23 Claims, 15 Drawing Sheets

LIGHT EMITTING DEVICE

CROSS-REFERENCE TO RELATED APPLICATION

This application claims priority from Korean Patent Application No. 10-2009-0005231 filed on Jan. 21, 2009 in the Korean Intellectual Property Office, the contents of which in its entirety are herein incorporated by reference.

SUMMARY

Apparatuses consistent with one or more exemplary embodiments relate to a light emitting device with a heat dissipation structure.

Light emitting devices such as light emitting diodes (LEDs) emit light when electrons and holes are combined. The light emitting devices have several advantages including low power consumption, extended life span, being installable without spatial limitation, and robustness against vibration.

The light emitting element may be classified into a vertical type, a lateral type, or a flip chip type light emitting element.

A light emitting element may be individually fabricated and encapsulated into a plastic package body for use in a light emitting device. A light emitting device using a package body includes a light emitting element, a sub mount on which the light emitting element is mounted, a slug having reflectivity, leads connecting the light emitting element to a circuit on a circuit board, a wire electrically connecting the leads to the light emitting element, a housing encapsulating the sub mount, a flexible printed circuit board (PCB) disposed below the housing, and a heat dissipation unit that dissipates heat from the flexible PCB.

In a light emitting device using a housing, a thermal barrier may be produced within the housing. In addition, heat may be smoothly dissipated into a lead frame on which a light emitting element is mounted while being poorly dissipated into the other lead frame to which a voltage is applied, thereby degrading the characteristics of the light emitting device.

In order to overcome this problem, research is being conducted to develop a method for attaching a separate heat dissipation unit to a light emitting device.

However, attaching a separate heat dissipation unit may adversely affect developing small-size light emitting devices and may undesirably increase the manufacturing costs.

One or more exemplary embodiments provide a light emitting device including a first lead frame, a second lead frame, a light emitting element and a housing, the first lead frame including a light emitting element mounting portion, a first heat dissipation portion extending from the light emitting element mounting portion in a first direction, and a pair of second heat dissipation portions extending from the light emitting element mounting portion in a second direction opposite to the first direction and divided into two separate branches, the second lead frame extending in the second direction and is disposed between and spaced apart from the pair of second heat dissipation portions, the light emitting element mounted on the light emitting element mounting portion and is electrically coupled to the first and second lead frames, and the housing encapsulating the first and second lead frames, wherein each of the second heat dissipation portions has a first width and the second lead frame has a second width the same as or different from the first width.

BRIEF DESCRIPTION OF THE DRAWINGS

The above and other aspects will become more apparent by describing in detail exemplary embodiments with reference to the attached drawings in which.

DETAILED DESCRIPTION OF THE EXEMPLARY EMBODIMENTS

Figure 1:
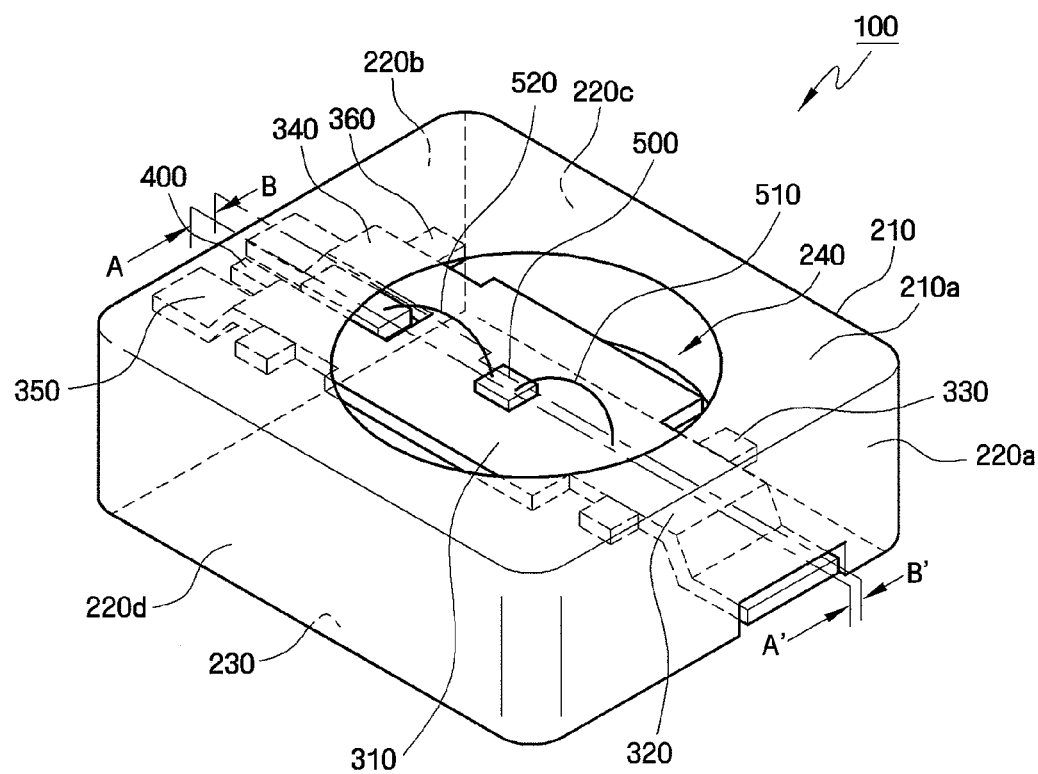
FIG. 1 is a perspective view of a light emitting device according to a first exemplary embodiment.

The exemplary embodiments may be understood more readily by reference to the following detailed description and the accompanying drawings. The exemplary embodiments may, however, be embodied in many different forms and should not be construed as being limited to the exemplary embodiments set forth herein. Rather, these exemplary embodiments are provided so that this disclosure will be thorough and complete and are not intended to limit the appended claims. In addition, in the drawings, the thickness of layers and regions are exaggerated for clarity.

The terminology used herein is for the purpose of describing particular exemplary embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will be further understood that the expression "A" or "B" is intended to include "A," "B," and "A and B." Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "below," "beneath," "lower," "above" or "upper" may be used herein to describe one element's relationship to other elements as illustrated in the Figures. It will be understood that relative terms are intended to encompass different orientations of the device in addition to the orientation depicted in the Figures.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
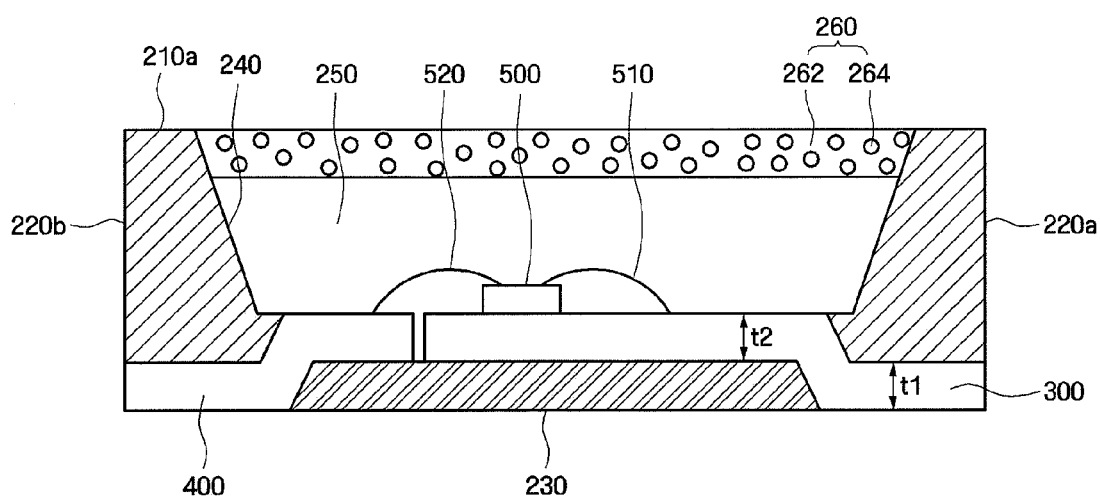
FIG. 2 is a cross-sectional view of the light emitting device taken along line A-A' of FIG. 1.
Figure 3:
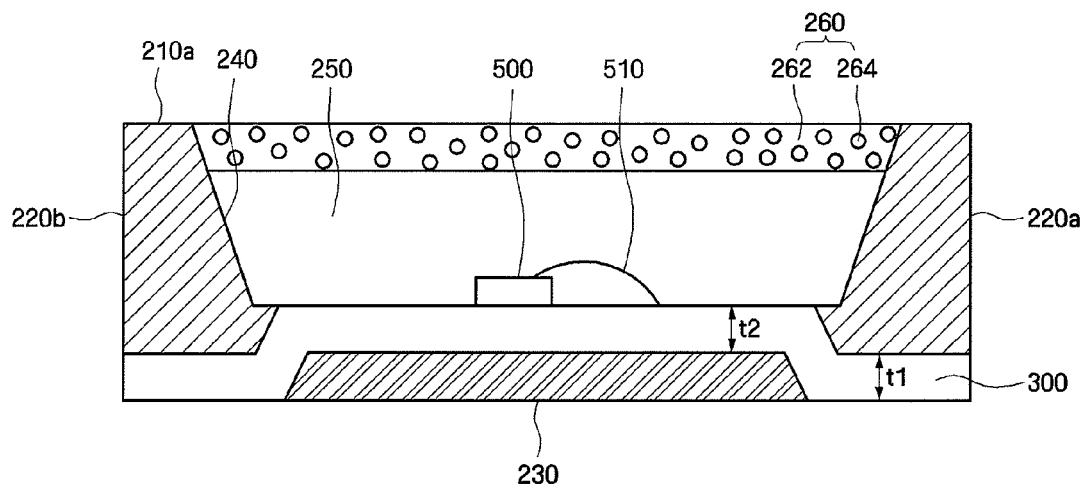
FIG. 3 is a cross-sectional view of the light emitting device taken along line B-B' of FIG. 1.
Figure 4:
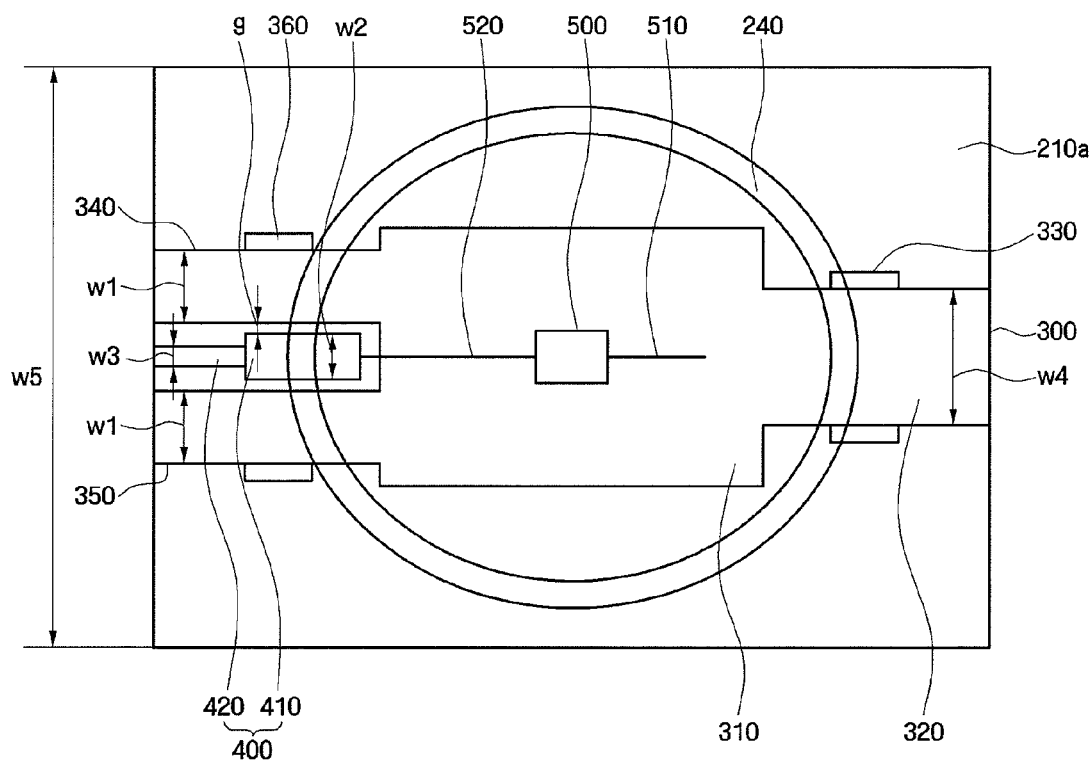
FIG. 4 is a top view of the light emitting device shown in FIG. 1.
Figure 5:
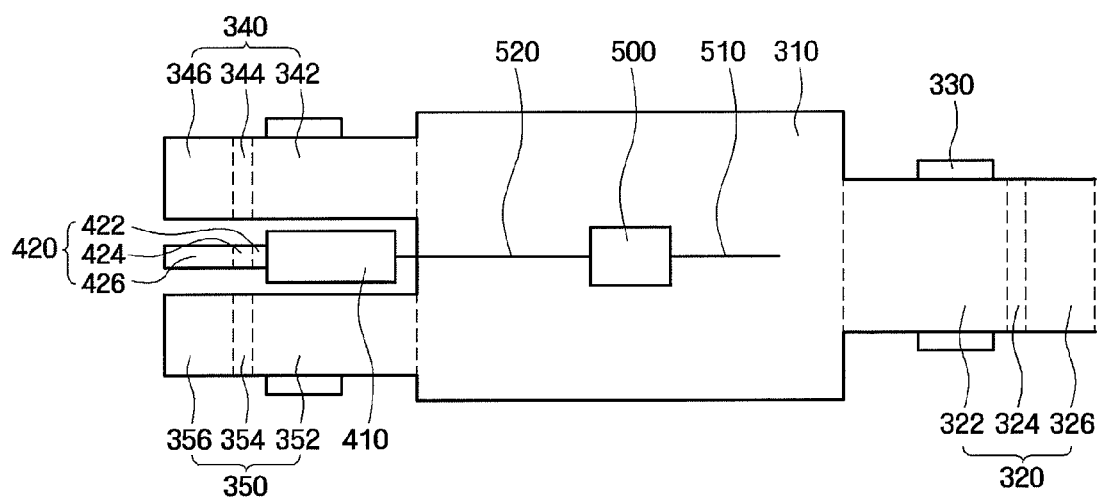
FIG. 5 is a top view of a lead frame in the light emitting device shown in FIG. 1.
Figure 6:
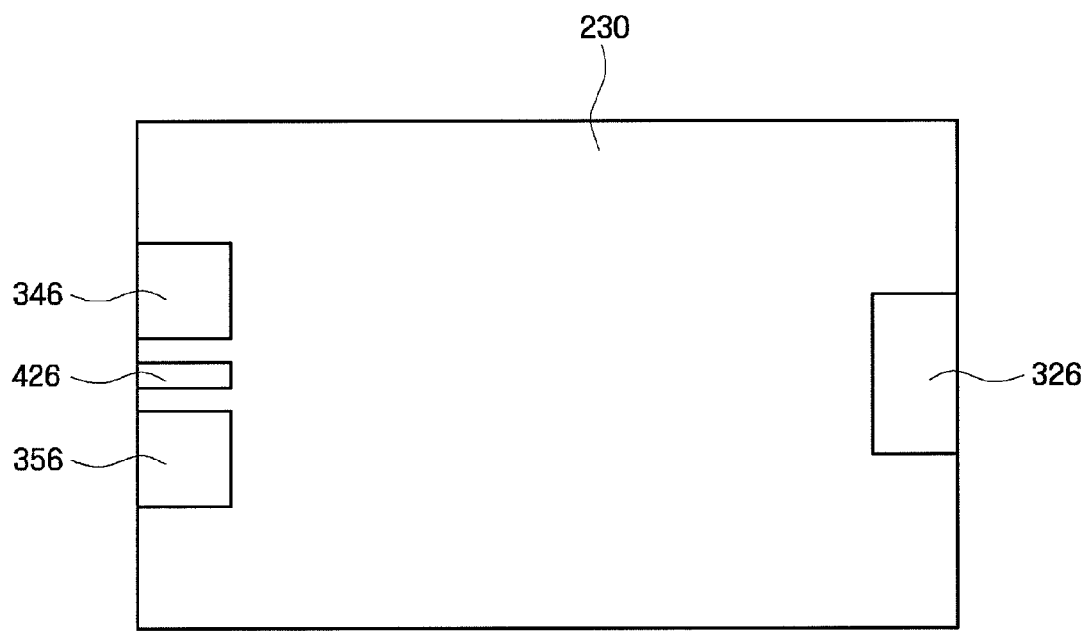
FIG. 6 is a bottom view of the light emitting device shown in FIG. 1.

Hereinafter, a light emitting device according to an exemplary embodiment is described in detail with reference to FIGS. 1 through 6. FIG. 1 is a perspective view of a light emitting device according to a first exemplary embodiment, FIG. 2 is a cross-sectional view of the light emitting device taken along line A-A' of FIG. 1, FIG. 3 is a cross-sectional view of the light emitting device taken along line B-B' of FIG. 1, FIG. 4 is a top view of the light emitting device shown in FIG. 1, FIG. 5 is a top view of a lead frame in the light emitting device shown in FIG. 1, and FIG. 6 is a bottom view of the light emitting device shown in FIG. 1.

Referring first to FIGS. 1 through 5, the light emitting device 100 according to the first exemplary embodiment includes first and second lead frames 300 and 400 encapsulated in a housing 210.

The first lead frame 300 has a light emitting element 500 mounted thereon and is adapted to dissipate heat generated by the light emitting element 500, thereby improving the performance of the light emitting element 500.

The light emitting element 500 is mounted on the first lead frame 300 and is electrically coupled to the first and second lead frames 300 and 400 via first and second wires 510 and 520, respectively.

The light emitting element 500 may be mounted on the first lead frame 300, for example, via an adhesive layer (not shown) having excellent thermal conductivity. The adhesion layer may be formed of silver (Ag) epoxy or tin (Sn)-based solder.

The housing 210 includes a bottom surface 230, a first endwall 220a, a second endwall 220b, a first sidewall 220c, and a second sidewall 220d surrounding the bottom surface 230, and a top surface 210a connecting the first and second endwalls 220a and 220b and first and second sidewalls 220c and 220d. A groove 240 is recessed from the top surface 210a towards the bottom surface 230. The light emitting element 500 is disposed on a light emitting element mounting portion 310 and inserted into the groove 240.

The housing 210 may be formed of an organic material having excellent lightfastness such as silicon resin, epoxy resin, acryl resin, urea resin, fluorine resin, or imide resin, or an inorganic material having excellent lightfastness such as glass or silica gel. In order to prevent melting of resin due to heat generated during the manufacturing process, the housing 210 may also be formed of a heat resistant resin. Further, various fillers such as aluminum nitride (AlN), aluminum oxide ($Al_2O_3$), and a composite mixture of AlN and $Al_2O_3$ may be mixed into resin so as to relieve thermal stress of the resin. The housing 210 is not limited thereto and a portion of the housing (e.g., 220a and 220b) or the entire housing (i.e., 210a, 220a, 220b, 220c, 220d, and 230) may be formed of a metal or ceramic. For example, if the entire housing (210a, 220a, 220b, 220c, 220d, and 230) is made of a metal, dissipation of heat generated by the light emitting element 500 is facilitated.

The first lead frame 300 may be formed of a material having high thermal and electrical conductivity such as iron (Fe), nickel (Ni), Al, and copper (Cu).

The first lead frame 300 includes a light emitting element mounting portion 310, a first heat dissipation portion 320 extending from the light emitting element mounting portion 310 in a first direction, and second and third heat dissipation portions 340 and 350 extending from the light emitting element mounting portion 310 in a second direction opposite to the first direction and divided into two separate branches. That is, the first heat dissipation portion 320 extends towards the first endwall 220a of the housing 210 while the second and third heat dissipation portions 340 and 350 and the second lead frame 400 extend toward the second endwall 220b that is disposed opposite the first endwall 220a.

In the present exemplary embodiment, the first heat dissipation portion 320 and the second and third heat dissipation portions 340 and 350 are adapted for dissipating heat from the light emitting element mounting portion 310 in both the first and second directions, thereby improving heat dissipation effect.

The second and third heat dissipation portions 340 and 350 are separated from each other, thereby further improving heat dissipation effect while preventing the first lead frame 300 from exiting the housing 210.

The second lead frame 400 is disposed between and spaced apart from the second and third heat dissipation portions 340 and 350. Referring to FIG. 4, a ratio of a first width w1 of the second and third heat dissipation portions 340 and 350 to a second width w2 of the second lead frame 400 is in a range between 1:1 and 4:1. Since the second and third heat dissipation portions 340 and 350 are disposed at either side of the second lead frame 400, the first width w1 can be increased freely while being limited only by a fifth width w5 of the housing 210. Accordingly, heat dissipation efficiency of the second and third heat dissipation portions 340 and 350 can be improved. If the ratio of the first width w1 to the second width w2 falls below the minimum limit of the range, a short circuit can occur. If the ratio of the first width w1 to the second width w2 exceeds the maximum limit of the range, the first width w1 of the second and third heat dissipation portions 340 and 350 is greater than the fifth width w5 so the second and third heat dissipation portions 340 and 350 protrude out from the housing 210. For example, if the fifth width w5 is 10 mm, the first and second widths w1 and w2 may be 4 mm and 1 mm, respectively. A gap g between the second heat dissipation portion 340 and the second lead frame 400 may be 0.5 mm. The gap g between the third heat dissipation portion 350 and the second lead frame 400 may be equal to the gap g between the second heat dissipation portion 340 and the second lead frame 400.

As described above, the second and third heat dissipation portions 340 and 350 are disposed on either side of the second lead frame 400, and the second lead frame 400 is positioned between the second and third heat dissipation portions 340 and 350 so as to be opposed to the first heat dissipation portion 320. Accordingly, the first heat dissipation portion 320, the light emitting element 500, and the second lead frame 400 are aligned with one another. Since the second lead frame 400 is disposed substantially at the center of the housing 210, the light emitting device 100 according to the present exemplary embodiment has a shorter second wire 520 than a light emitting device with the second lead frame 400 disposed near an edge of the housing 210.

The first heat dissipation portion 320 has a fourth width w4. Although FIG. 4 shows the fourth width w4 is greater than the first width w1 in order to further improve heat dissipation effect, this configuration is merely exemplary, and the fourth width w4 may be less than the first width w1.

The light emitting device 100 further includes a first protrusion 330 and a second protrusion 360 in order to tightly fasten the first heat dissipation portion 320 and the second and third heat dissipation portions 340 and 350 to the housing 210. The first protrusion 330 and the second protrusion 360 are disposed on one or both sides of the first heat dissipation portion 320 and the second and third heat dissipation portions 340 and 350, respectively, in order to increase the fourth width w4 of the first heat dissipation portion 320 as well as the first width w1 of the second heat dissipation portions 340 and 350. Thus, the first heat dissipation portion 320 and the second and third heat dissipation portions 340 and 350 can be prevented from exiting the housing 210 due to external forces.

Further, the second lead frame 400 includes an extension 410 having the second width w2 and a power applying portion 420 connected to the extension 410 and having a third width w3 that is less than the second width w2. Therefore, it becomes difficult for the second lead frame 400 to separate from the housing 210.

As shown in FIG. 2, a thickness t1 of the first heat dissipation portion 320 may be made equal to a thickness t2 of the light emitting element mounting portion 310 so as to facilitate the manufacturing of the first lead frame 300.

Referring to FIGS. 2, 3, 5, and 6, at least portions of the first, second, and third heat dissipation portions 320, 340, and 350 have step height differences. Further, at least portions of the first, second and third heat dissipation portions 320, 340, and 350 are exposed to the bottom surface 230 of the housing 210. The first heat dissipation portion 320 includes a first extending part 322 extending from the light emitting element mounting portion 310 to have the same height as the light emitting element mounting portion 310, a first exposed heat dissipation part 326 having at least a portion thereof exposed to the bottom surface 230 due to its step height difference from the light emitting element mounting portion 310, and a first height adjusting part 324 connecting the first extending part 322 with the first exposed heat dissipation part 326.

Similarly, the second and third heat dissipation portions 340 and 350 include second and third extending parts 342 and 352, second and third exposed heat dissipation parts 346 and 356, and second and third height adjusting parts 344 and 354, corresponding to their counterparts in the first heat dissipation portion 320.

The second lead frame 400 includes the extension 410 having the same height as the light emitting element mounting portion 310, a fourth extending part 422 extending from the extension 410 to have the same height as the extension 410, a fourth exposed heat dissipation part 426 having at least a portion thereof exposed to the bottom surface 230 due to its step height difference relative to the fourth extending part 422, and a fourth height adjusting part 424 connecting the fourth extending part 422 with the fourth exposed heat dissipation part 426.

As shown in FIG. 6, the first through fourth exposed heat dissipation parts 326, 346, 356, and 426 are exposed at the bottom surface 230 of the housing 210, thereby improving the heat dissipation effect.

Referring to FIGS. 2 and 3, the groove 240 of the housing 210, 220*a*, 220*b*, and 230 is filled with a transparent resin layer 250. The transparent resin layer 250 fills a portion of or the entire groove 240. For example, the transparent resin layer 250 may be formed of epoxy resin, silicon resin, hard silicon resin, modified silicon resin, urethane resin, oxetane resin, acryl resin, polycarbonate resin, or polyimide resin.

A phosphor layer 260 is formed on the transparent resin layer 250. The phosphor layer 260 is a mixture of a transparent resin 262 and phosphors 264. The phosphors 264 dispersed in the phosphor layer 260 absorb light emitted from the light emitting element 500 and convert it into different wavelength light. Thus, the higher the uniformity of the phosphors, the better the light emission characteristics. In this case, the phosphors 264 serve to improve the effects of wavelength conversion and color mixing.

For example, the phosphor layer 260 may be configured such that the light emitting device 100 produces white light. If the light emitting device 100 emits light with a blue wavelength, the phosphor layer 260 may include yellow phosphors. The phosphor layer 260 may also contain red phosphors in order to enhance the Color Rendering Index (CRI). Otherwise, if the light emitting device 100 emits light with an ultraviolet (UV) wavelength, the phosphor layer 260 may include red, green, and blue (RGB) phosphors.

The transparent resin 262 may be formed of any material that can stably disperse the phosphors 264. Examples of the transparent resin 262 may include epoxy resin, silicon resin, hard silicon resin, modified silicon resin, urethane resin, oxetane resin, acryl resin, polycarbonate resin, and polyimide resin.

The phosphors 264 may be any materials that can absorb light from the light emitting element 500 and convert it into light with a different wavelength. For example, the phosphors 264 may be at least one selected from the group consisting of a nitride-based/oxynitride-based phosphor, mainly activated by lanthanoids such as Eu and Ce; an alkaline earth halogen apatite phosphor, an alkaline earth metal borate halogen phosphor, an alkaline earth metal aluminate phosphor, an alkaline earth silicate phosphor, an alkaline earth sulfide phosphor, an alkaline earth thiogallate phosphor, a thiosilicate phosphor, an alkaline earth silicon nitride phosphor, a germinate phosphor, and a rare earth aluminate phosphor, mainly activated by lanthanoids such as Ce; a rare earth silicate phosphor, an organic material or organic complex, mainly activated by lanthanoids such as Ce. For example, the phosphors shown below can be used but are not limited thereto.

Examples of the nitride-based phosphor that is mainly activated by lanthanoid elements such as Eu and Ce include $M_2Si_5N_8$:Eu (M represents at least one element selected from Sr, Ca, Ba, Mg and Zn). In addition to $M_2Si_6N_8$:Eu, the examples also include $MSi_7N_{10}$:Eu, $M_{1.8}Si_5O_{0.2}N_8$:Eu, and $M_{0.9}Si_7O_{0.1}N_{10}$Eu (M represents at least one element selected from Sr, Ca, Ba, Mg and Zn).

Examples of the oxynitride phosphor that is mainly activated by lanthanoid elements such as Eu and Ce include $MSi_2O_2N_2$:Eu (M represents at least one element selected from Sr, Ca, Ba, Mg and Zn).

Examples of the alkaline earth halogen apatite phosphor that is mainly activated by lanthanoid elements such as Eu, or by transition metal elements such as Mn include $M_5(PO_4)_3$X:R (M represents at least one element selected from Sr, Ca, Ba, Mg and Zn. X represents at least one element selected from F, Cl, Br, and I, and R represents either Eu or Mn)

Examples of the alkaline earth metal borate halogen phosphor include $M_2B_5O_9$X:R (M represents at least one element selected from Sr, Ca, Ba, Mg and Zn. X represents at least one element selected from F, Cl, Br, and I, and R represents either Eu or Mn).

Examples of the alkaline earth metal aluminate phosphor include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R represents at least one selected from Eu and Mn).

Examples of the alkaline earth sulfide phosphor include $La_2O_2S$:Eu, $Y_2O_2S$:Eu and $Gd_2O_2S$:Eu.

Examples of the rare earth aluminate phosphor that is mainly activated by lanthanoid elements such as Ce include YAG based phosphor represented by the formulas: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$. The examples also include $Tb_3Al_5O_{12}$:Ce and $Lu_3Al_5O_{12}$:Ce in which portion or all of Y is substituted with Tb or Lu.

Examples of the alkaline earth metal silicate phosphor include silicates represented by the formula: $(SrBa)_2SiO_4$:Eu.

Examples of other phosphors include ZnS:Eu, $Zn_2GeO_4$:Mn, and $MGa_2S_4$:Eu (M represents at least one element selected from Sr, Ca, Ba, Mg and Zn).

If necessary, the phosphors described above can contain at least one element selected from Tb, Cu, Ag, Au, Cr, Nd, Dy, Co, Ni and Ti, in place of Eu, or in addition to Eu.

It is possible to use a phosphor which is other than the phosphor described above and has the similar performances and effects as those of the phosphors.

A filter (not shown) is selectively disposed on the phosphor layer 260 and absorbs light having a specific wavelength. The filter may absorb primary light emitted by the light emitting element 500, but not secondary light emitted from the phosphor layer 260. The filter may be formed of a material that can absorb light having a specific wavelength and disperse heat. For example, the filter may be formed of organic or inorganic dyes. In particular, if the light emitting element 500 is an ultraviolet (UV) light emitting diode, a UV filter may be used because excessive UV light exposure is harmful to the human body.

Figure 7:
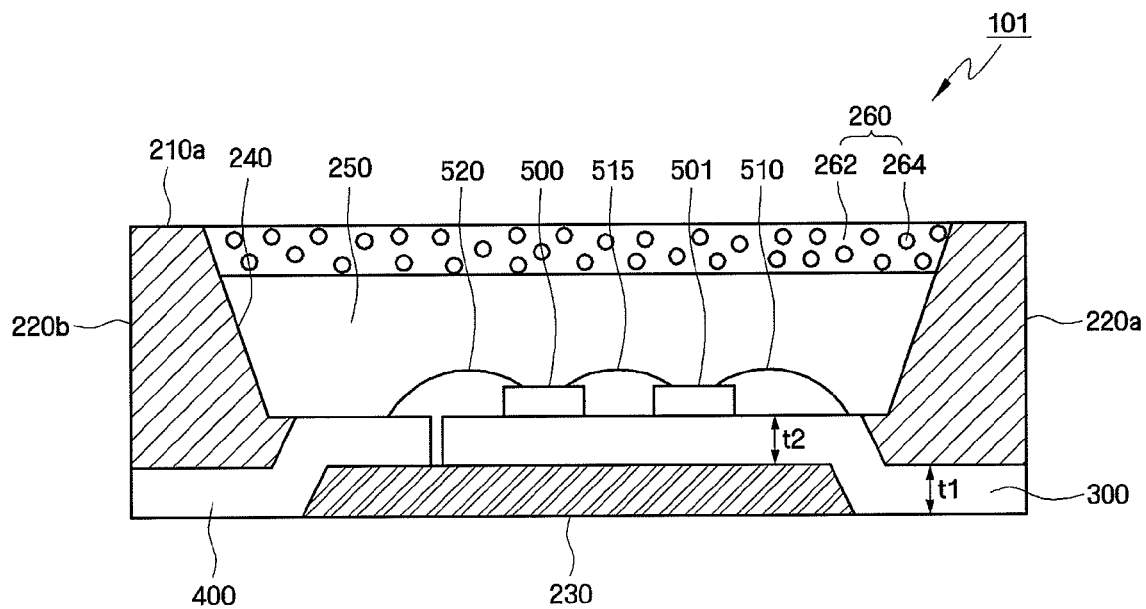
FIG. 7 is a cross-sectional view of a light emitting device according to a second exemplary embodiment.

A light emitting device according to a second exemplary embodiment is described with reference to FIG. 7. FIG. 7 is a cross-sectional view of a light emitting device according to a second exemplary embodiment.

Hereinafter, the same elements as those of the first exemplary embodiment shown in FIGS. 1 through 6 are denoted by the same reference numerals and an explanation thereof will be made briefly or omitted herein.

Referring to FIG. 7, at least one first light emitting element 500 and at least one second light emitting element 501 are mounted on a first lead frame 300. The first and second light emitting elements 500 and 501 may connect to each other in series or in parallel via a third wire 515. The light emitting device 101 according to the second exemplary embodiment has the plurality of light emitting elements 500 and 501 mounted therein, thus providing improved output power.

Figure 8:
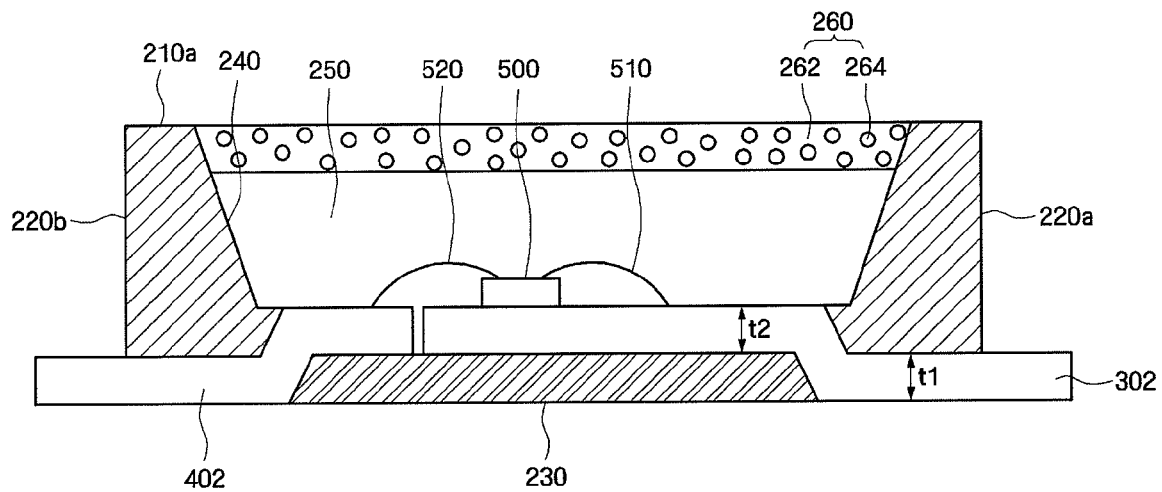
FIG. 8 is a cross-sectional view of a light emitting device according to a third exemplary embodiment.

A light emitting device according to a third exemplary embodiment is described with reference to FIG. 8. FIG. 8 is a cross-sectional view of a light emitting device 102 according to a third exemplary embodiment.

Referring to FIG. 8, the light emitting device 102 according to the third exemplary embodiment is configured so that portions of first and second lead frames 302 and 402 project toward and through first and second endwalls 220a and 220b of housing 210, respectively, thereby providing improved heat dissipation. The light emitting device 102 may be more suitable for use in a large illumination module than the light emitting device 100.

Figure 9:
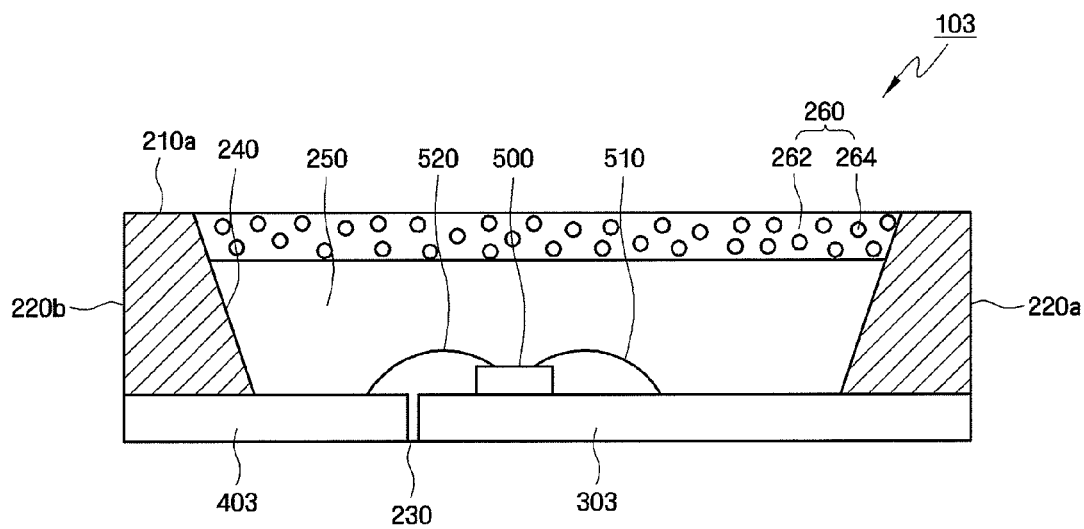
FIG. 9 is a cross-sectional view of a light emitting device according to a fourth exemplary embodiment, taken along the same line of FIG. 2 (i.e., line A-A')
Figure 10:
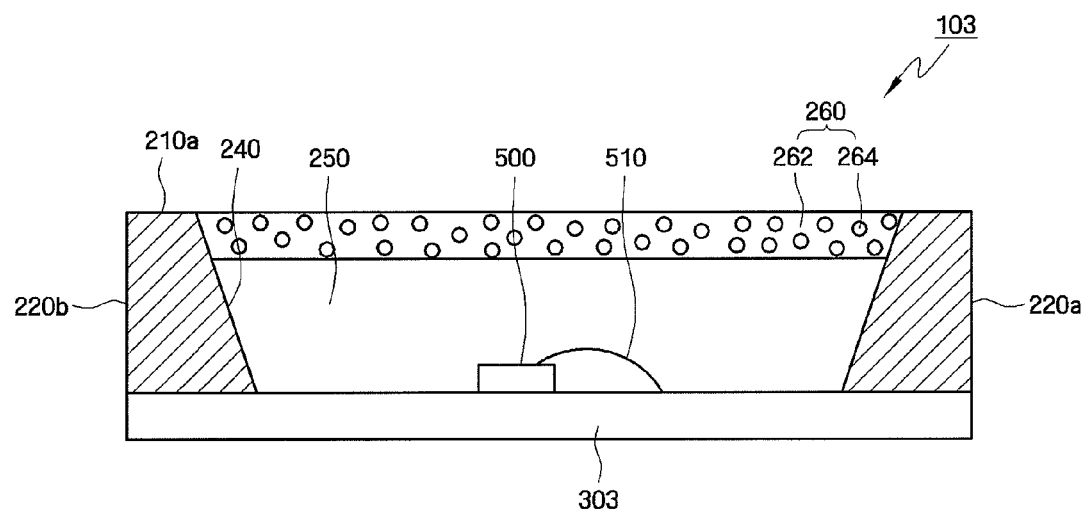
FIG. 10 is a cross-sectional view of a light emitting device according to a fourth exemplary embodiment, taken along the same line of FIG. 3 (i.e., line B-B')
Figure 11:
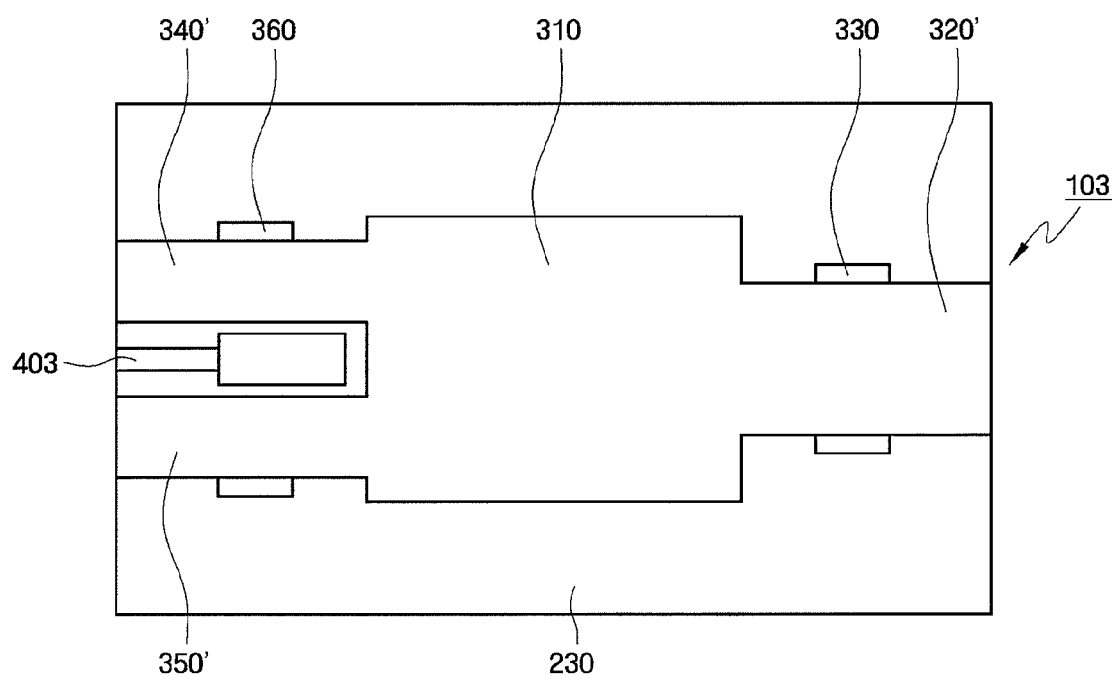
FIG. 11 is a bottom view of the light emitting device shown in FIG. 10.

A light emitting device according to a fourth exemplary embodiment of the inventive concept is described with reference to FIGS. 9 through 11. FIG. 9 is a cross-sectional view of a light emitting device according to a fourth exemplary embodiment, taken along the same line of FIG. 2 (i.e., line A-A'). FIG. 10 is a cross-sectional view of a light emitting device according to a fourth exemplary embodiment, taken along the same line of FIG. 3 (i.e., line B-B'). FIG. 11 is a bottom view of the light emitting device shown in FIG. 10.

Referring to FIGS. 9 and 10, the light emitting device 103 according to the fourth exemplary embodiment has first and second planar lead frames 303 and 403 mounted at a bottom surface 230 of the housing 210. As shown in FIG. 11, a first heat dissipation portion 320' and second and third heat dissipation portions 340' and 350' are all exposed to the bottom surface 230 of the housing 210. Thus, the exposed area of the first lead frame 303 acting as a heat sink is increased, thereby improving the heat dissipation effect.

Figure 12:
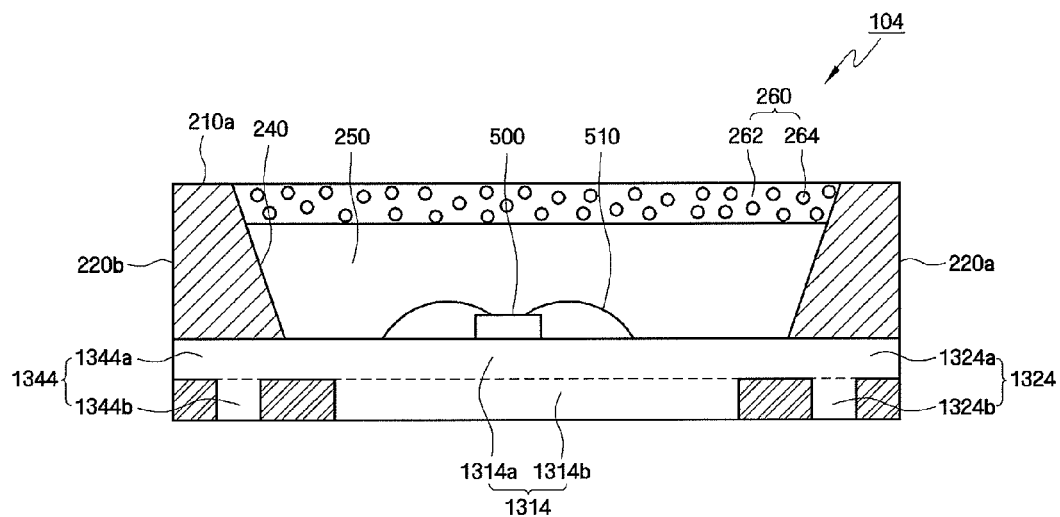
FIG. 12 is a cross-sectional view of a light emitting device according to a fifth exemplary embodiment.

A light emitting device according to a fifth exemplary embodiment is described with reference to FIG. 12. FIG. 12 is a cross-sectional view of a light emitting device 104 according to a fifth exemplary embodiment.

Referring to FIG. 12, a light emitting element mounting portion 1314 includes a planar part 1314a and an exposed part 1314b extending from the planar portion 1314a and exposed to a bottom surface 230 of a housing 210. Similarly, the first and second heat dissipation portions 1324 and 1344 respectively include planar parts 1324a and 1344a and exposed parts 1324b and 1344b extending from the planar parts 1324a and 1344a and exposed to the bottom surface 230. The exposed parts 1314b, 1324b, and 1344b may be thicker than the planar parts 1314a, 1324a, and 1344a.

Figure 13:
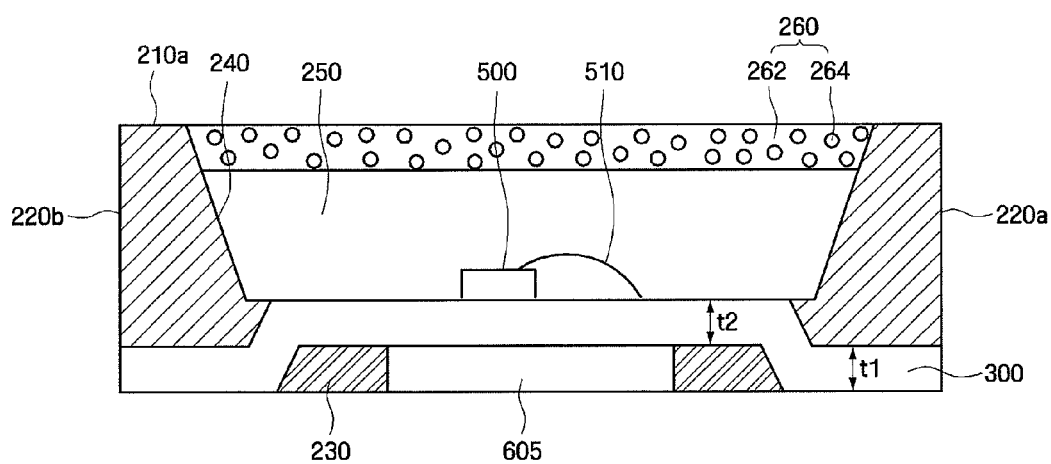
FIG. 13 is a cross-sectional view of a light emitting device according to a sixth exemplary embodiment.

A light emitting device according to a sixth exemplary embodiment is described with reference to FIG. 13. FIG. 13 is a cross-sectional view of a light emitting device 105 according to a sixth exemplary embodiment.

Referring to FIG. 13, the light emitting device 105 according to the sixth exemplary embodiment further includes an internal heat dissipation unit 605 contacting a bottom surface of a first lead frame 300 and exposed to a bottom surface 230 of a housing 210.

That is, the light emitting device 105 has the internal heat dissipation unit 605 in addition to the construction of the light emitting device 100, thereby providing improved heat dissipation effect.

Figure 14:
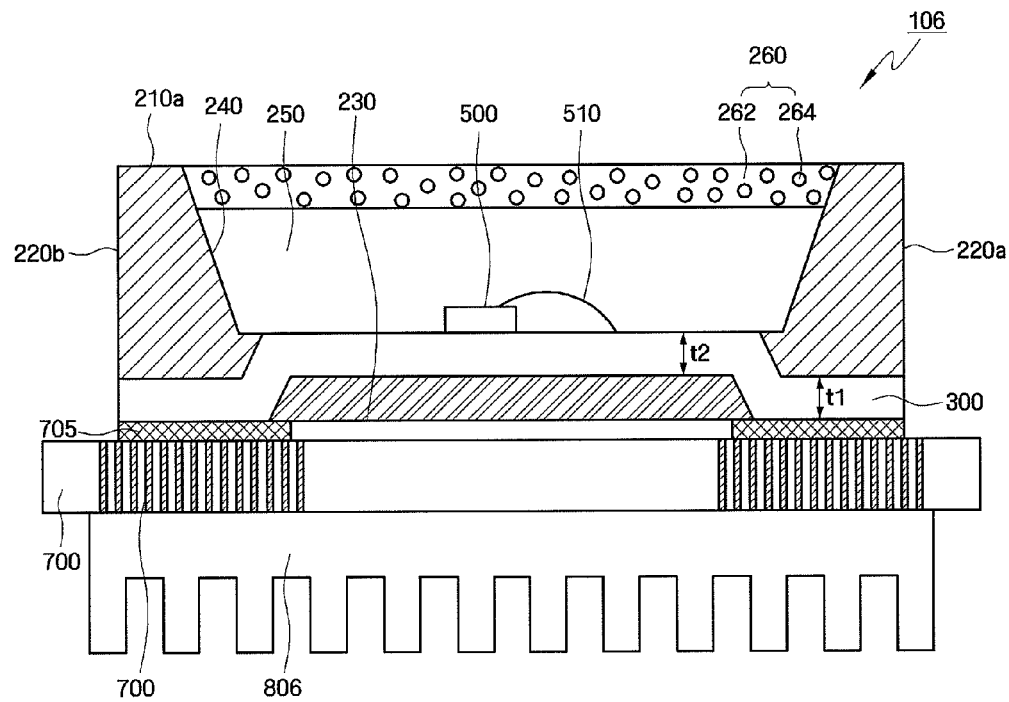
FIG. 14 is a cross-sectional view of a light emitting device according to a seventh exemplary embodiment.

A light emitting device according to a seventh exemplary embodiment is described with reference to FIG. 14. FIG. 14 is a cross-sectional view of a light emitting device according to a seventh exemplary embodiment.

Referring to FIG. 14, the light emitting device 106 according to the seventh exemplary embodiment further includes a circuit board 700 having heat conductive vias 716 formed thereon and an external heat dissipation unit 806 connected to the heat conductive vias 716. A first lead frame 300 is also connected to the heat conductive vias 716 through a solder 705. The external heat dissipation unit 806 may be a heat sink, heat pipe, or water cooler. For example, the heat sink may be formed of Al, Cu, or graphite.

Figure 15:
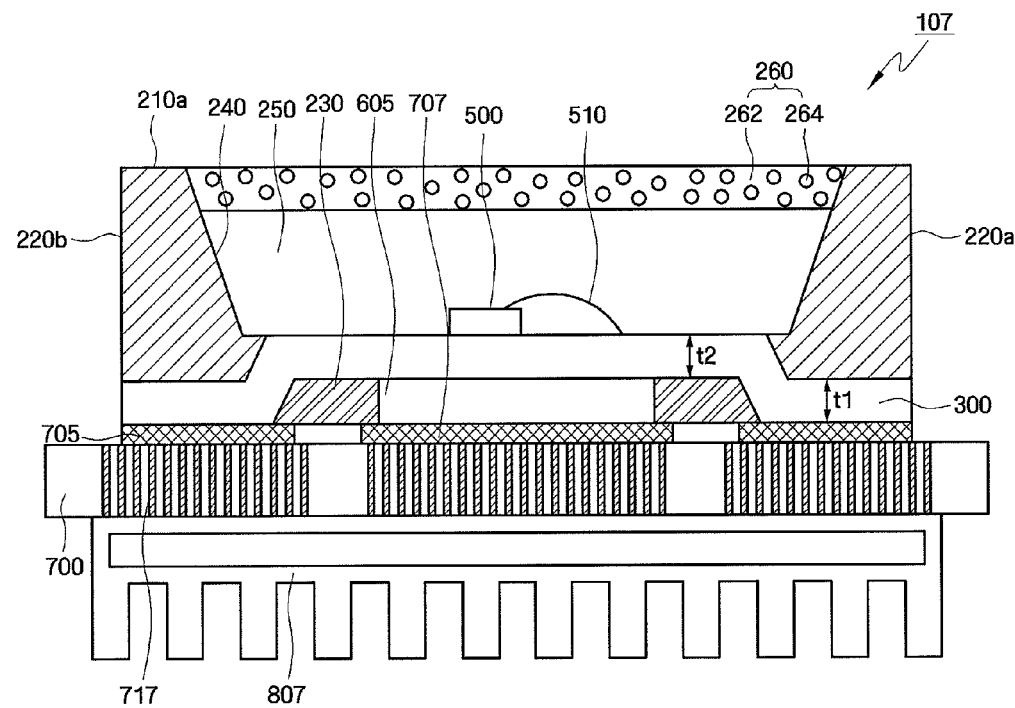
FIG. 15 is a cross-sectional view of a light emitting device according to an eighth exemplary embodiment.

A light emitting device according to an eighth exemplary embodiment is described with reference to FIG. 15. FIG. 15 is a cross-sectional view of a light emitting device 107 according to an eighth exemplary embodiment.

Referring to FIG. 15, the light emitting device 107 according to the eighth exemplary embodiment includes both an internal heat dissipation unit 605 coupled to a first lead frame 300 and an external heat dissipation unit 807, thereby providing further improved heat dissipation effect. The internal heat dissipation unit 605 is connected to heat conductive vias 717 through a solder 707 while the heat conductive vias 717 are connected to the external heat dissipation unit 807.

Figure 16:
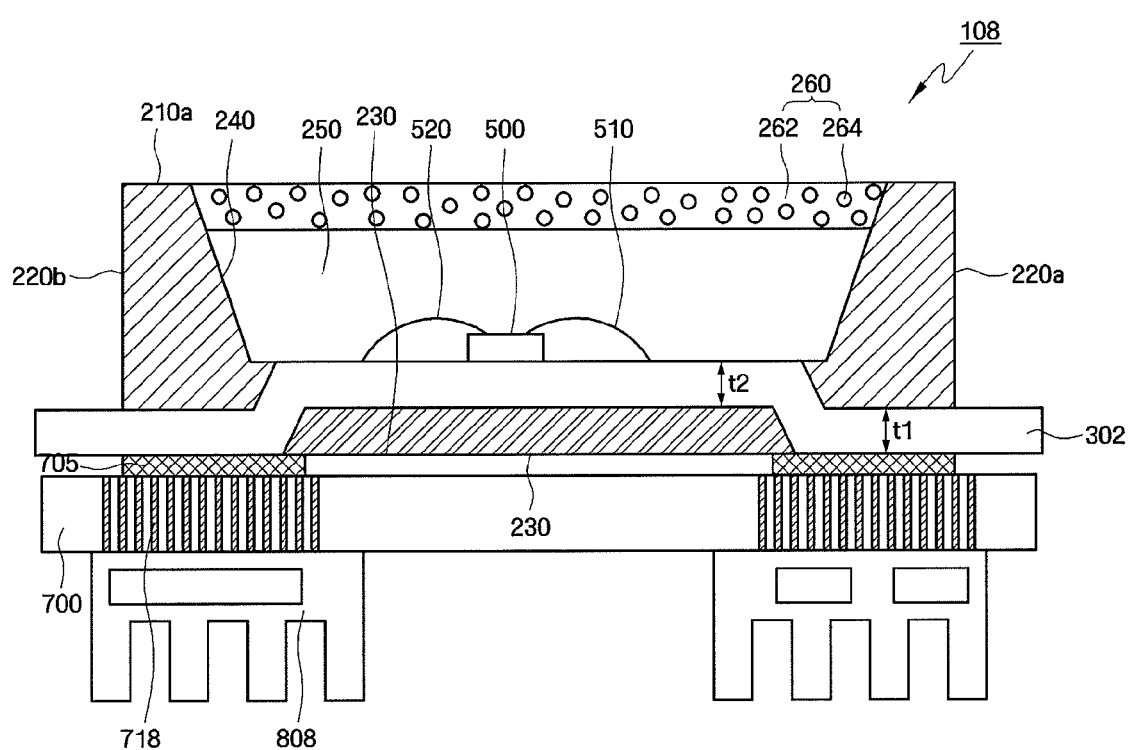
FIG. 16 is a cross-sectional view of a light emitting device according to a ninth exemplary embodiment.

A light emitting device according to a ninth exemplary embodiment is described with reference to FIG. 16. FIG. 16 is a cross-sectional view of a light emitting device 108 according to a ninth exemplary embodiment.

Referring to FIG. 16, a first lead frame 302 projects toward first and second endwalls 220a and 220b of a housing 210. The projecting first lead frame 302 is connected to heat conductive vias 718 through a solder 705 while the heat conductive vias 718 are connected to an external heat dissipation unit 808.

Figure 17:
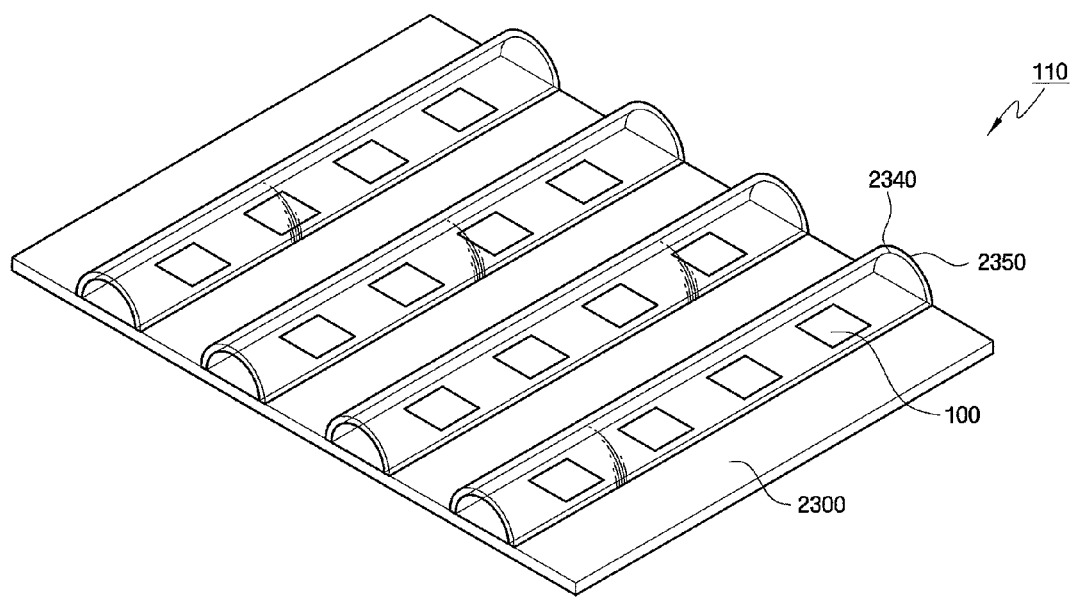
FIGS. 17 and 18 are diagrams for explaining light emitting device according to a tenth exemplary embodiment.
Figure 18:
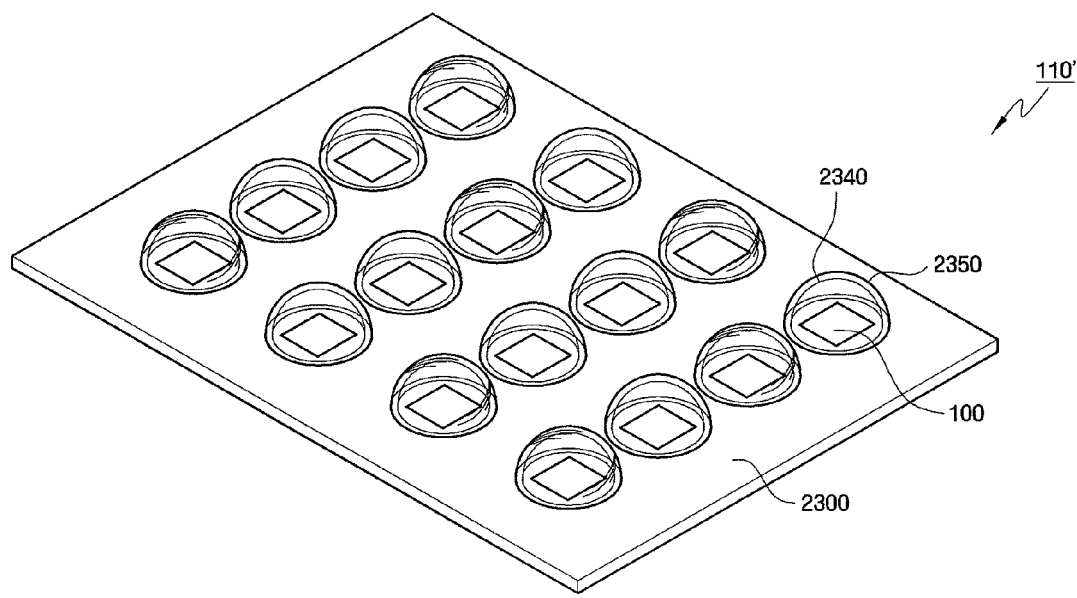

FIGS. 17 and 18 are diagrams for explaining a light emitting device according to a tenth exemplary embodiment.

Referring to FIGS. 17 and 18, a plurality of light emitting devices 100 (or the respective light emitting devices 101 through 108) according to first to ninth exemplary embodiments, each having a phosphor layer 2340 and a transparent resin 2350, are arranged on a transparent substrate 2300. Here, the phosphor layer 260 of the light emitting devices 100 through 108 formed in the first to ninth exemplary embodiments may not be formed. For convenience of explanation, the construction of the light emitting device 100 is briefly shown.

In the light emitting device 110 according to the tenth exemplary embodiment, the phosphor layer 2340 and the transparent resin 2350 are formed to have a line type structure as shown in FIG. 17. More specifically, if the plurality of light emitting elements 500 are arranged in one direction, the phosphor layer 2340 and the transparent resin 2350 may be formed along the same direction.

Referring to FIG. 18, in the light emitting device 110' according to the modified example, a plurality of phosphor layers 2340 and a plurality of transparent resins 2350 are formed to have a dot type structure. Each of the plurality of phosphor layers 2340 and each of the plurality of transparent resins 2350 enclose a corresponding one of the light emitting devices 100.

Figure 19:
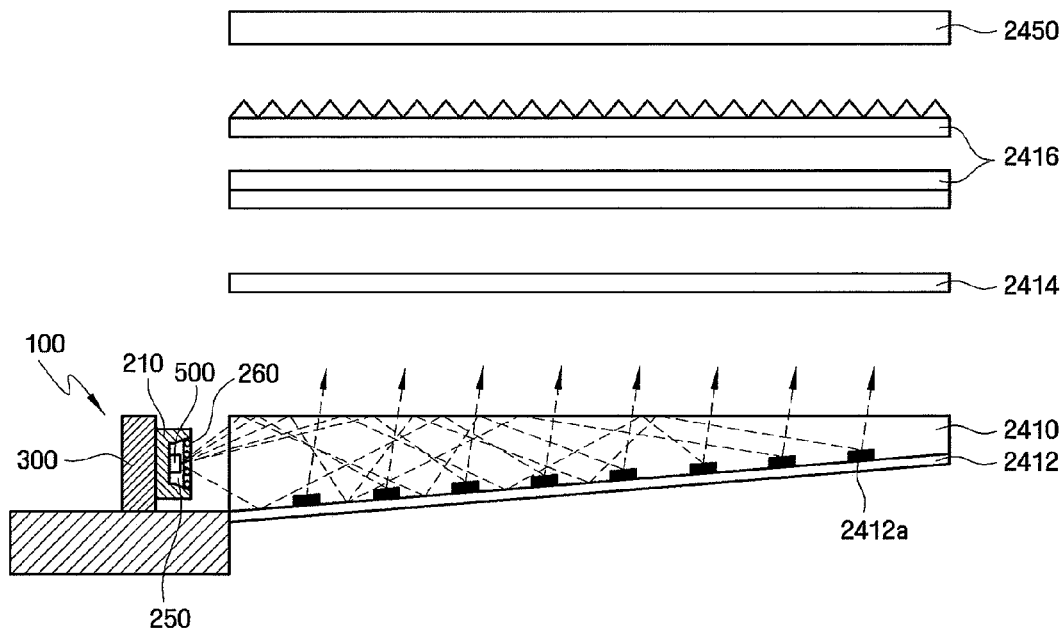
FIG. 19 illustrates a light emitting device according to an eleventh exemplary embodiment.

FIG. 19 illustrates a light emitting device according to an eleventh exemplary embodiment.

FIG. 19 illustrates an end product using the light emitting device 100 having the light emitting element 500 mounted therein. The light emitting device according to the eleventh exemplary embodiment can be applied to various devices including illuminating devices, displays, and mobile devices such as mobile phones, MP3 players, and navigation systems. The end product shown in FIG. 19 is an edge-type back light unit (BLU) for use in a liquid crystal display (LCD). Since an LCD is not a self-emissive display device, a BLU is used as a light source for the LCD and illuminates an LCD panel from the back.

Referring to FIG. 19, the BLU includes a light emitting device 100, a light guide plate 2410, a reflection sheet 2412, a diffusion sheet 2414, and a pair of prism sheets 2416.

The light emitting element 500 is a side-view type and provides light. As described above, the light emitting element 500 is seated in a groove of a housing 210 in the light emitting device 100. The light guide plate 2410 guides light that is provided to an LCD panel 2450. The light guide plate 2410 is a panel made of a transparent plastic material such as acryl and allows light generated by the light emitting element 500 to propagate toward the LCD panel 2450 disposed thereon. Thus, the light guide plate 2410 has various patterns 2412a printed on the rear surface thereof so as to change a propagation direction of incident light toward the LCD panel 2450.

The reflection sheet 2412 is disposed on a bottom surface of the light guide plate 2410 and reflects light escaping from the bottom surface of the light guide plate 2410 in an upward direction. That is, the reflection sheet 2412 reflects light not reflected by the various patterns 2412a back toward an exit surface of the light guide plate 2410. This configuration cannot only reduce light loss but also improve the uniformity of light escaping through the exit surface of the light guide plate 2410.

The diffusion sheet 2414 disperses light exiting the light guide plate 2410, thereby preventing a partial concentration of light. Each of the pair of prism sheets 2416 has a plurality of triangular prisms periodically arranged on a top surface thereof. The pair of prism sheets 2416 may include two sheets with the plurality of triangular prisms arranged in a staggered fashion so that light diffused by the diffusion sheet 2414 propagates perpendicular to the LCD panel 2450.

Figure 20:
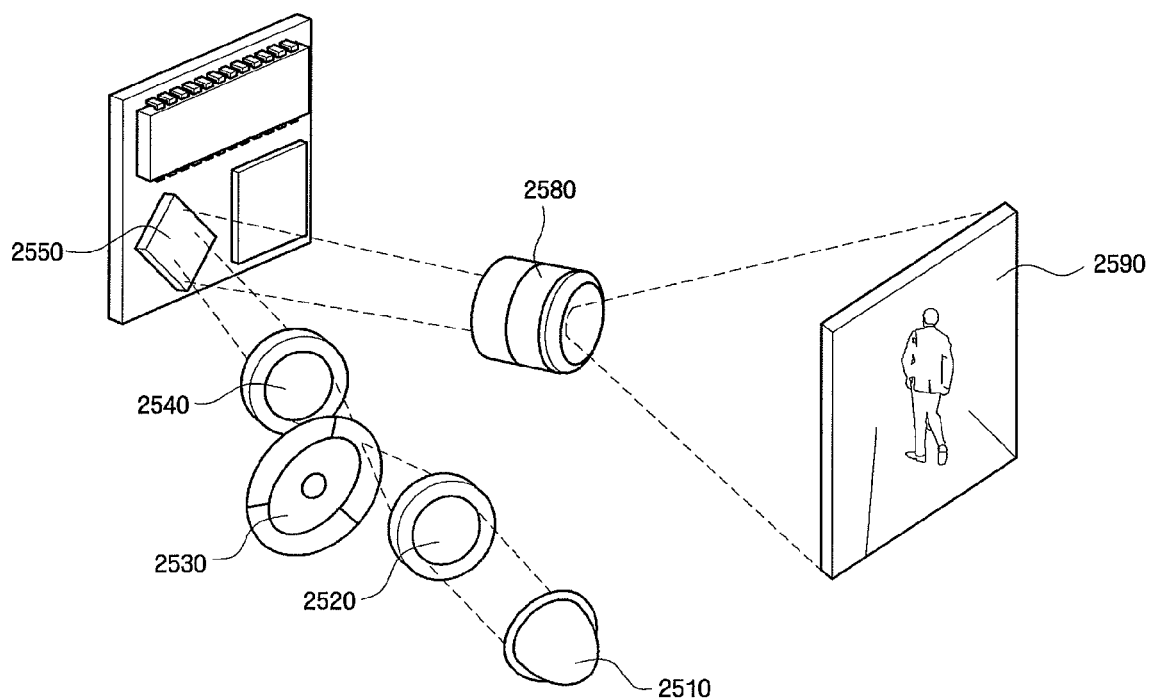
FIGS. 20 through 23 illustrate exemplary devices to which light emitting devices according to the first to eleventh exemplary embodiments may be applied.
Figure 21:
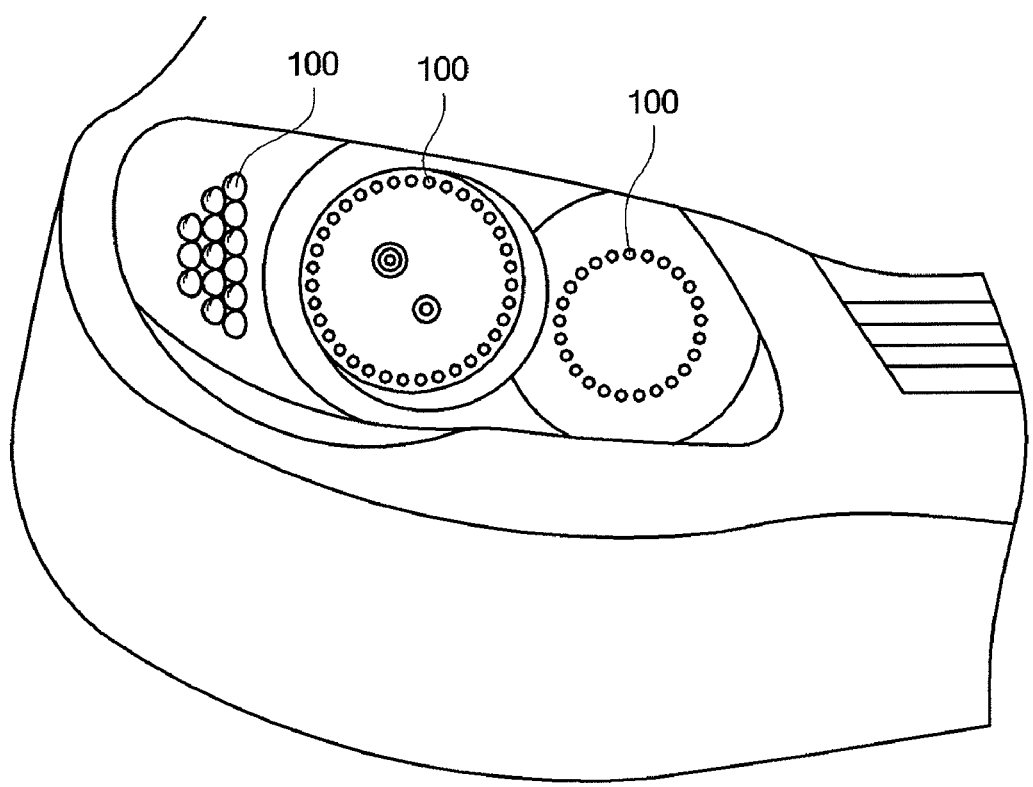
Figure 22:
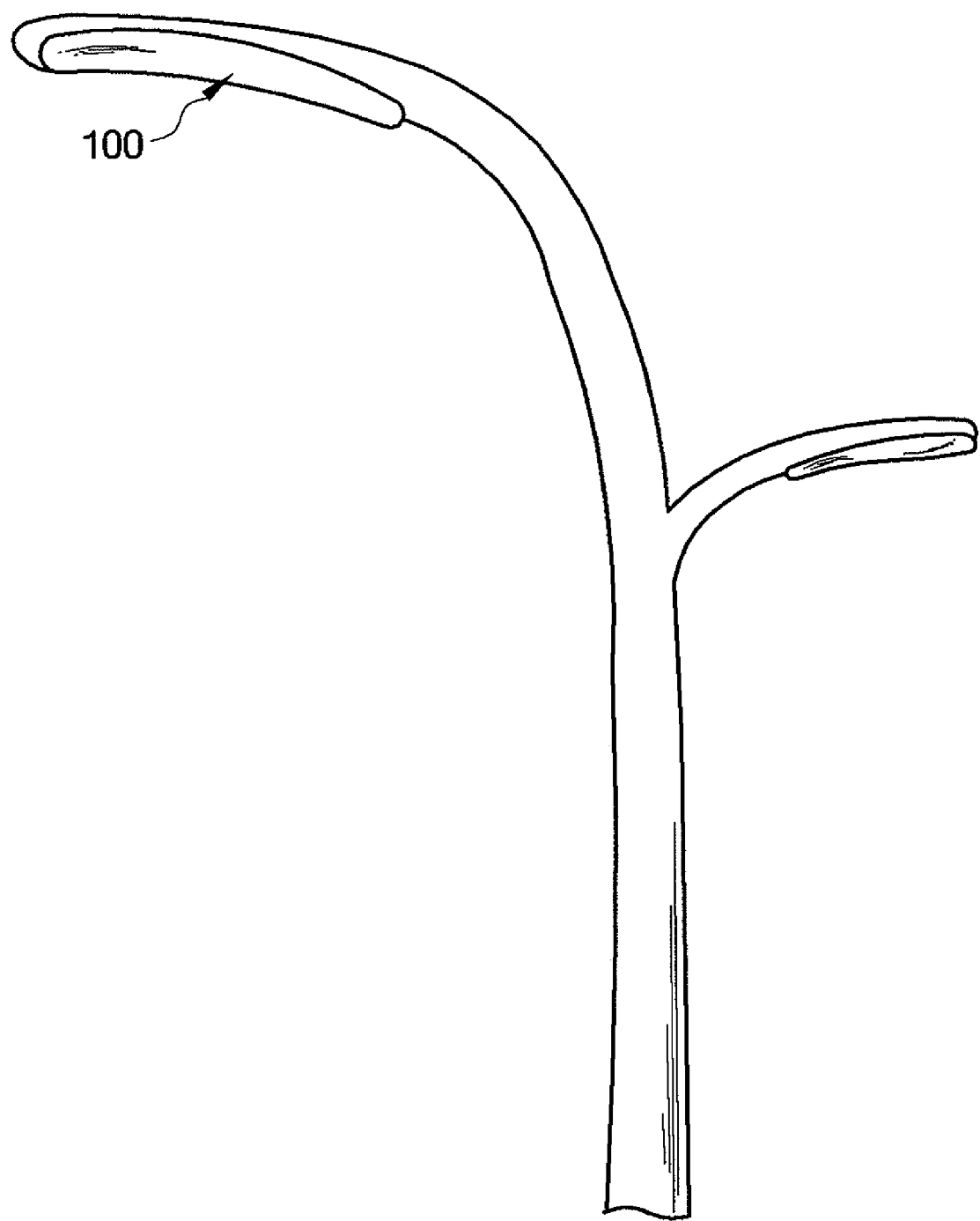
Figure 23:
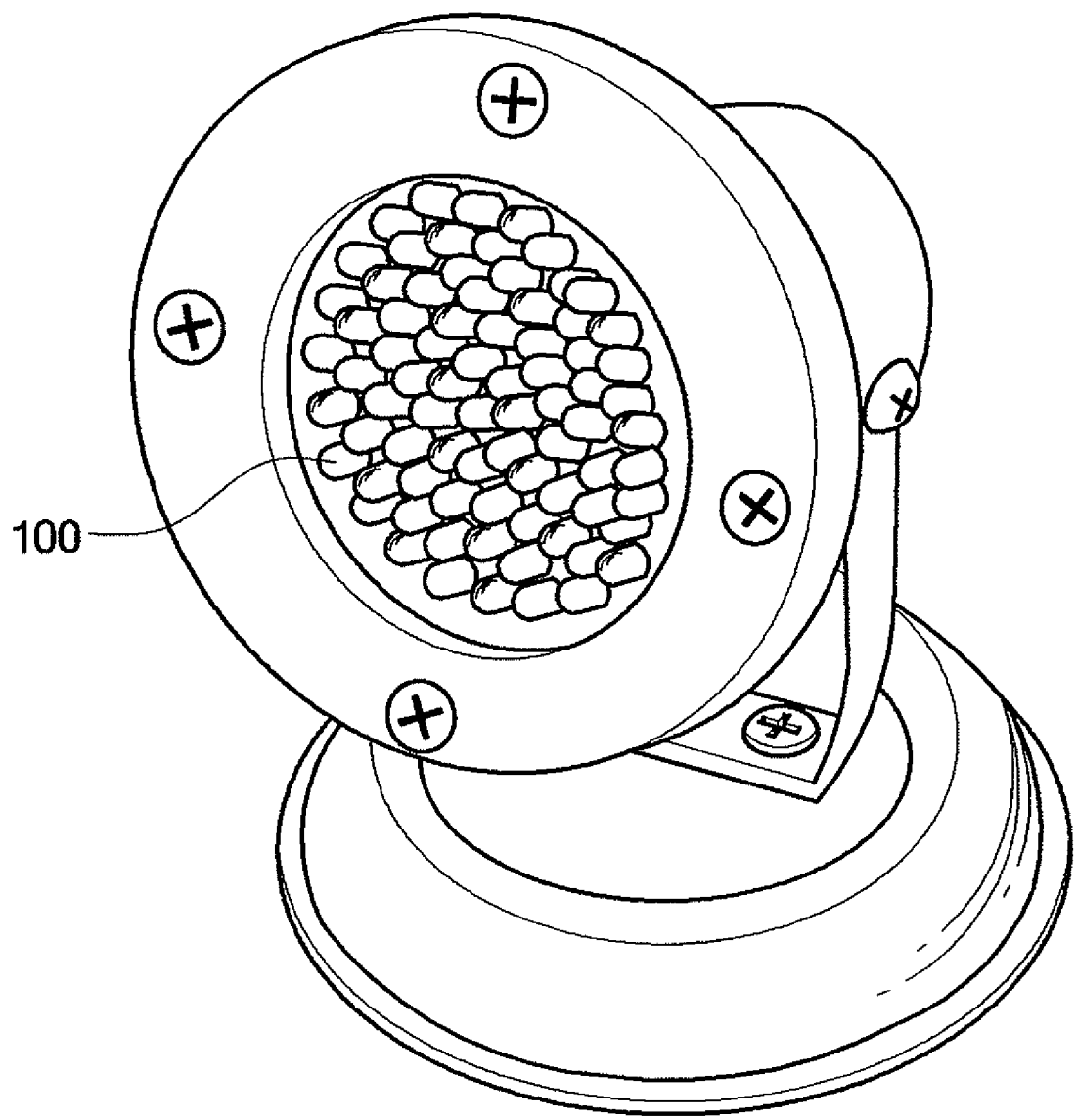

FIGS. 20 through 23 illustrates exemplary devices (end products) using a submount as described above, where FIG. 20 illustrates a projector, FIG. 21 illustrates a car headlight, FIG. 22 illustrates a street lamp, and FIG. 23 illustrates an illuminating lamp, respectively. The light emitting devices 100 shown in FIGS. 20 through 23 may be top-view type devices.

Referring to FIG. 20, light emitted from a light source 2510 passes through a condensing lens 2520, a color filter 2530, a sharping lens 2540, is reflected by a digital micromirror device (DMD) 2550, and passes through a projection lens 2580 for projection onto a screen 2590. A submount and a light emitting element according to one of the exemplary embodiments may be disposed within the light source 2510.

While exemplary embodiments have been particularly shown and described with reference to the drawings, it will be understood by those of ordinary skill in the art that various changes in form and details may be made therein without departing from the spirit and scope of the following claims. It is therefore desired that the exemplary embodiments be considered in all respects as illustrative and not restrictive, reference being made to the appended claims rather than the foregoing description to indicate the scope of the claims.

What is claimed is:

1. A light emitting device comprising:
    a first lead frame comprising a light emitting element mounting portion, a first heat dissipation portion that extends from the light emitting element mounting portion in a first direction, second and third heat dissipation portions that extend from the light emitting element mounting portion in a second direction different from the first direction, and a first protrusion disposed perpendicular to, and extending from a middle portion of, at least one of the second heat dissipation portion and the third heat dissipation portion;

a second lead frame that extends in the second direction and is disposed between and spaced apart from the second and third heat dissipation portions;

a light emitting element that is disposed on the light emitting element mounting portion and electrically coupled to the first and second lead frames; and a housing that encapsulates the first and second lead frames, wherein each of the second and third heat dissipation portions has a first width, and the second lead frame has a second width the same as or different from the first width.

2. The light emitting device of claim 1, wherein the first direction is opposite to the second direction.

3. The light emitting device of claim 2, wherein the second width is less than the first width.

4. The light emitting device of claim 1, wherein a ratio of the first width to the second width is in a range between 1:1 and 4:1.

5. The light emitting device of claim 1, wherein the first heat dissipation portion, the light emitting element, and the second lead frame are coplanar with one another.

6. The light emitting device of claim 1, wherein the first lead frame further comprises a second protrusion that is disposed perpendicular to the first heat dissipation portion.

7. The light emitting device of claim 1, wherein the second lead frame includes an extension having the second width and a power applying part connected to the extension and having a third width.

8. The light emitting device of claim 7, wherein the third width is less than the second width.

9. The light emitting device of claim 7, wherein the extension is disposed closer to the first heat dissipation portion than the power applying part.

10. The light emitting device of claim 1, wherein the first heat dissipating portion has a fourth width that is less than the first width.

11. The light emitting device of claim 1, wherein the first heat dissipating portion has a fourth width that is greater than or equal to the first width.

12. The light emitting device of claim 1, wherein the light emitting element mounting portion, the first heat dissipation portion, the second heat dissipation portion, and the third heat dissipation portion have a substantially equal thickness.

13. The light emitting device of claim 12, wherein at least one of the first, second, and third heat dissipation portions include portions having different heights, and at least one of the first, second, and third heat dissipation portions include a portion that is exposed to a bottom surface of the housing.

14. The light emitting device of claim 13, further comprising an internal heat dissipation unit that is disposed within the housing, wherein the internal heat dissipation unit contacts the first lead frame and is exposed to the bottom surface of the housing.

15. The light emitting device of claim 14, further comprising a circuit board having heat conductive vias formed thereon and an external heat dissipation unit connected to the heat conductive vias, wherein the first and second lead frames are coupled to the heat conductive vias.

16. The light emitting device of claim 13, further comprising a circuit board having heat conductive vias formed thereon and an external heat dissipation unit connected to the heat conductive vias, wherein the first and second lead frames are coupled to the heat conductive vias.

17. The light emitting device of claim 12, wherein each of the first, second, and third heat dissipating portions comprises an extending part that extends from the light emitting element mounting portion, a height adjusting part that extends from the extending part, and an exposed heat dissipation part that extends from the height adjusting part.

18. The light emitting device of claim 17, wherein the extending parts of the first, second, and third heat dissipating portions have a different height from the exposed heat dissipation parts of the first, second and third heat dissipating portions, respectively.

19. The light emitting device of claim 18, wherein the exposed heat dissipation part of each of the first, second, and third heat dissipating portions is exposed to a bottom surface of the housing.

20. The light emitting device of claim 1, wherein at least one of the first lead frame and the second lead frame extends outside of the housing.

21. The light emitting device of claim 1, wherein each of the light emitting element mounting portion, the first heat dissipation portion, the second heat dissipation portion, and the third heat dissipation portion includes a planar part and an exposed part that extends from the planar part toward a bottom surface of the housing and is exposed to the bottom surface of the housing.

22. A light emitting apparatus comprising:

a transparent substrate;

a plurality of light emitting devices that is disposed on the transparent substrate in a line type structure;

a phosphor layer and a transparent resin that are arranged in a line type structure and enclose the plurality of light emitting devices;

wherein each light emitting device of the plurality of light emitting devices comprises:

a first lead frame comprising a light emitting element mounting portion, a first heat dissipation portion that extends from the light emitting element mounting portion in a first direction, second and third heat dissipation portions that extend from the light emitting element mounting portion in a second direction different from the first direction, and a first protrusion disposed perpendicular to, and extending from a middle portion of, at least one of the second heat dissipation portion and the third heat dissipation portion;

a second lead frame that extends in the second direction and is disposed between and spaced apart from the second and third heat dissipation portions;

a light emitting element that is disposed on the light emitting element mounting portion and electrically coupled to the first and second lead frames; and a housing that encapsulates the first and second lead frames, wherein each of the second and third heat dissipation portions has a first width, and the second lead frame has a second width the same as or different from the first width.

23. A light emitting apparatus comprising:

a transparent substrate;

a plurality of light emitting devices disposed on the transparent substrate in a dot type structure;

a plurality of phosphor layers and a plurality of transparent resins arranged in a dot type structure, wherein each phosphor layer of the plurality of phosphor layers and each transparent resin of the plurality of transparent resins enclose a corresponding light emitting device of the plurality of light emitting devices;

wherein each light emitting device of the plurality of light emitting devices comprises:

a first lead frame comprising a light emitting element mounting portion, a first heat dissipation portion that extends from the light emitting element mounting portion in a first direction, second and third heat dissipation portions that extend from the light emitting element mounting portion in a second direction different from the first direction, and a first protrusion disposed perpendicular to, and extending from a middle portion of, at least one of the second heat dissipation portion and the third heat dissipation portion;

a second lead frame that extends in the second direction and is disposed between and spaced apart from the second and third heat dissipation portions;

a light emitting element that is disposed on the light emitting element mounting portion and electrically coupled to the first and second lead frames; and a housing that encapsulates the first and second lead frames, wherein each of the second and third heat dissipation portions has a first width, and the second lead frame has a second width that is the same as or different from the first width.

* * * * *